US009636673B2

(12) United States Patent
Olde Riekerink et al.

(10) Patent No.: US 9,636,673 B2
(45) Date of Patent: May 2, 2017

(54) METHOD FOR MANUFACTURING MICROFLUIDIC CHIPS, DEVICE FOR FUNCTIONALIZING MICROFLUIDIC CHIPS, MICROFLUIDIC CHIP AND DEVICE FOR HOLDING A MICROFLUIDIC CHIP

(71) Applicant: Micronit Microfluidics B.V., Enschede (NL)

(72) Inventors: Marinus Bernardus Olde Riekerink, Losser (NL); Wilfred Buesink, Hengelo (NL); Arenda Hendrika Jacoba Koelewijn-Hubers, Enschede (NL); Marko Theodoor Blom, Enschede (NL); Ronny van 't Oever, Epse (NL)

(73) Assignee: Micronit Microfluidics B.V., Enschede (NL)

( * ) Notice: Subject to any disclaimer, the term of this patent is extended or adjusted under 35 U.S.C. 154(b) by 456 days.

(21) Appl. No.: 13/782,752

(22) Filed: Mar. 1, 2013

(65) Prior Publication Data

US 2014/0246801 A1    Sep. 4, 2014

(51) Int. Cl.
*B01L 3/00* (2006.01)
*B81C 1/00* (2006.01)
(Continued)

(52) U.S. Cl.
CPC .... *B01L 3/502707* (2013.01); *B81C 1/00206* (2013.01); *B01J 2219/00286* (2013.01);
(Continued)

(58) Field of Classification Search
None
See application file for complete search history.

(56) References Cited

U.S. PATENT DOCUMENTS 6,770,434 B2 *   8/2004   Shvets et al. ............ 435/4
6,933,164 B2 *   8/2005   Kubena ............... 438/49
(Continued)

FOREIGN PATENT DOCUMENTS

EP   1221617   7/2002
EP   2269947   1/2011
(Continued)

*Primary Examiner* — Jeffrey Wollschlager
(74) *Attorney, Agent, or Firm* — Rudy J. Ng; Bret E. Field; Bozicevic, Field & Francis LLP

(57) ABSTRACT

The invention relates to a method for manufacturing microfluidic chips having at least one capillary for through-flow of a fluid, comprising the steps of:
  (a) providing a starting material;
  (b) forming at least one shared capillary in the starting material, said shared capillary comprising an fluidic inlet and an fluidic outlet;
  (c) functionalizing the chips by supplying a functionalization fluid to the shared capillary; and
  (d) dividing the starting material into separate chips.
The invention further relates to a device for functionalizing microfluidic chips having at least one capillary for through-flow of a fluid, said device comprising a material holder for holding a starting material in a fixed position during functionalization, said material holder comprising at least one inlet connector for connecting at least one shared capillary formed in the starting material to a functionalization fluid supply.
The invention further relates to a microfluidic chip and a device for holding a microfluidic chip.

10 Claims, 18 Drawing Sheets

(51) Int. Cl.
*B29C 70/54* (2006.01)
*B29C 69/00* (2006.01)
*B01L 9/00* (2006.01)

(52) U.S. Cl.
CPC ........... *B01J 2219/00585* (2013.01); *B01J 2219/00637* (2013.01); *B01L 9/527* (2013.01); *B01L 2300/0816* (2013.01); *B01L 2300/0883* (2013.01); *B01L 2300/16* (2013.01); *B29C 69/005* (2013.01); *B29C 70/545* (2013.01); *B29C 2793/0009* (2013.01); *B29C 2793/0027* (2013.01); *B29C 2793/0063* (2013.01); *B81B 2201/058* (2013.01); *Y10T 137/8593* (2015.04); *Y10T 156/1052* (2015.01)

(56) References Cited

U.S. PATENT DOCUMENTS

| | | | |
|---|---|---|---|
| 8,343,441 B2 * | 1/2013 | van 't Oever et al. | 422/502 |
| 2004/0000045 A1 | 1/2004 | McEntee et al. | |
| 2004/0037739 A1 * | 2/2004 | McNeely | B01F 5/10 422/417 |
| 2004/0245521 A1 * | 12/2004 | Faris | 257/40 |
| 2007/0122819 A1 * | 5/2007 | Wu | B01L 3/502746 435/6.11 |
| 2007/0132043 A1 * | 6/2007 | Bradley et al. | 257/414 |
| 2010/0159572 A1 * | 6/2010 | Chen et al. | 435/287.1 |
| 2011/0000283 A1 * | 1/2011 | van 't Oever et al. | 73/40 |
| 2011/0123413 A1 * | 5/2011 | Abate et al. | 422/502 |
| 2011/0126914 A1 * | 6/2011 | Hartman et al. | 137/13 |
| 2012/0122084 A1 * | 5/2012 | Wagner et al. | 435/6.1 |
| 2012/0186977 A1 * | 7/2012 | Sjong | 204/451 |
| 2013/0108801 A1 * | 5/2013 | Naessens et al. | 427/535 |

FOREIGN PATENT DOCUMENTS

| | | | |
|---|---|---|---|
| EP | 2404867 | * | 1/2012 |
| WO | WO2008072968 | | 6/2008 |
| WO | WO2011057091 | | 5/2011 |
| WO | WO2012026942 | | 3/2012 |

* cited by examiner

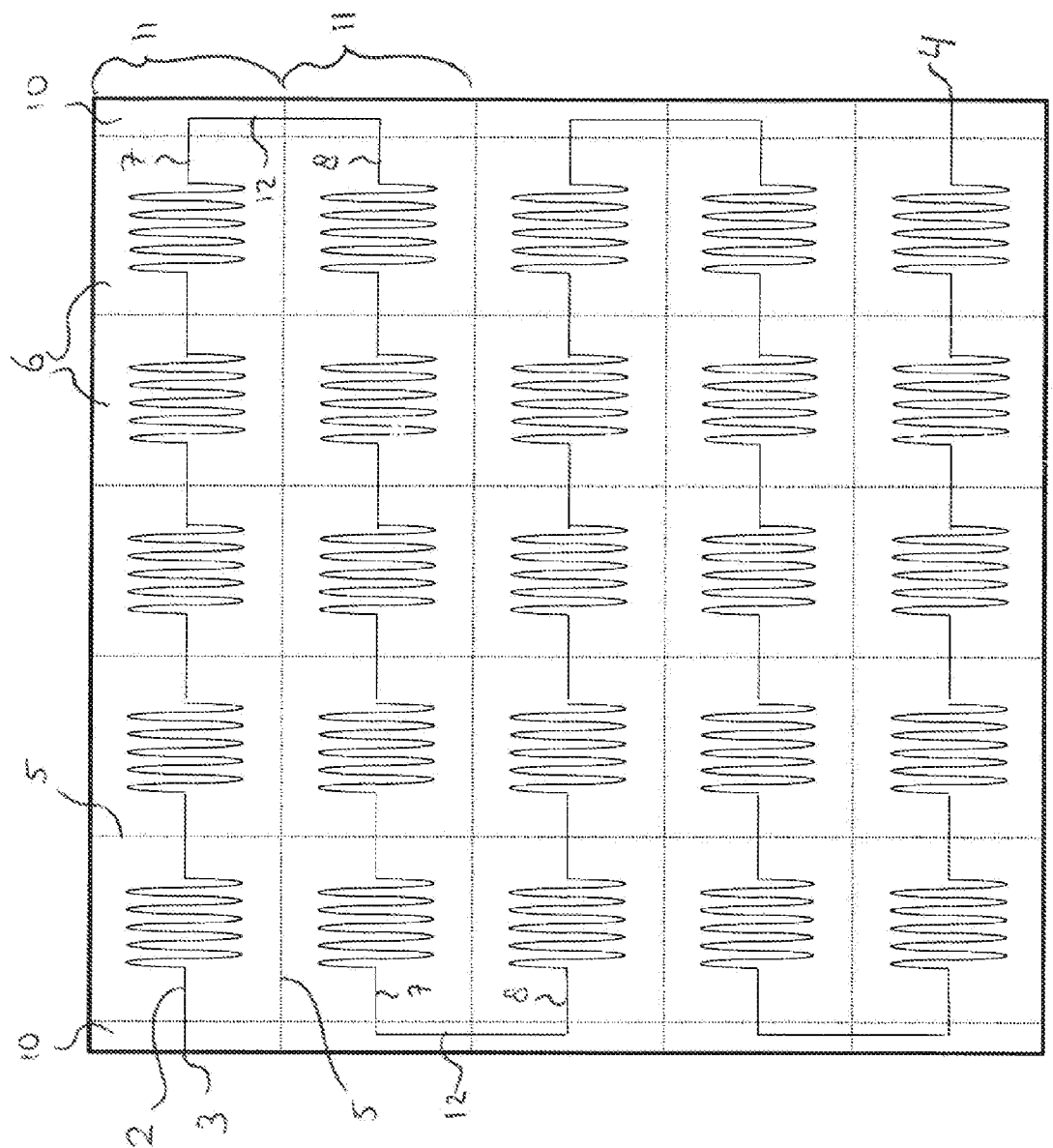

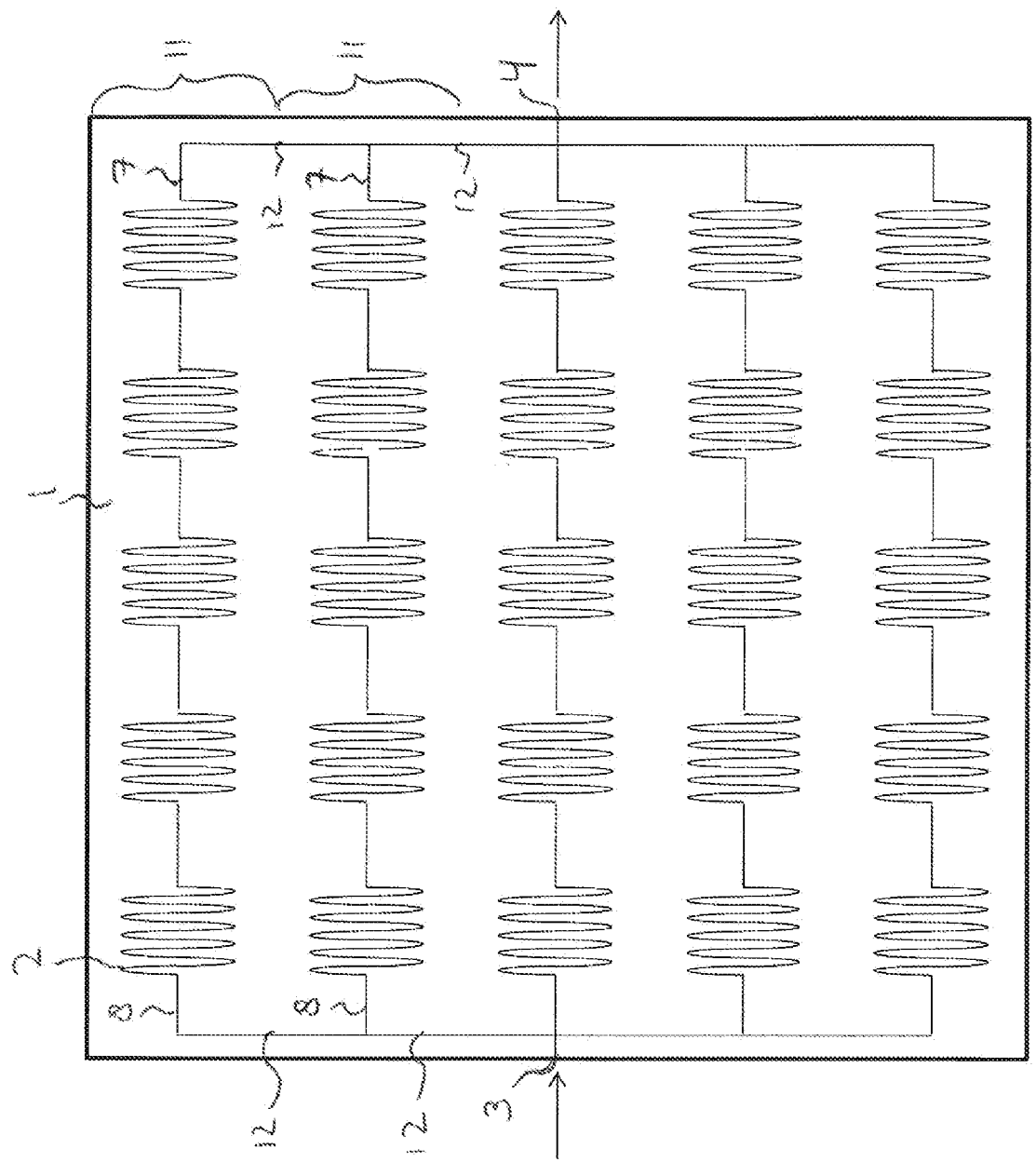

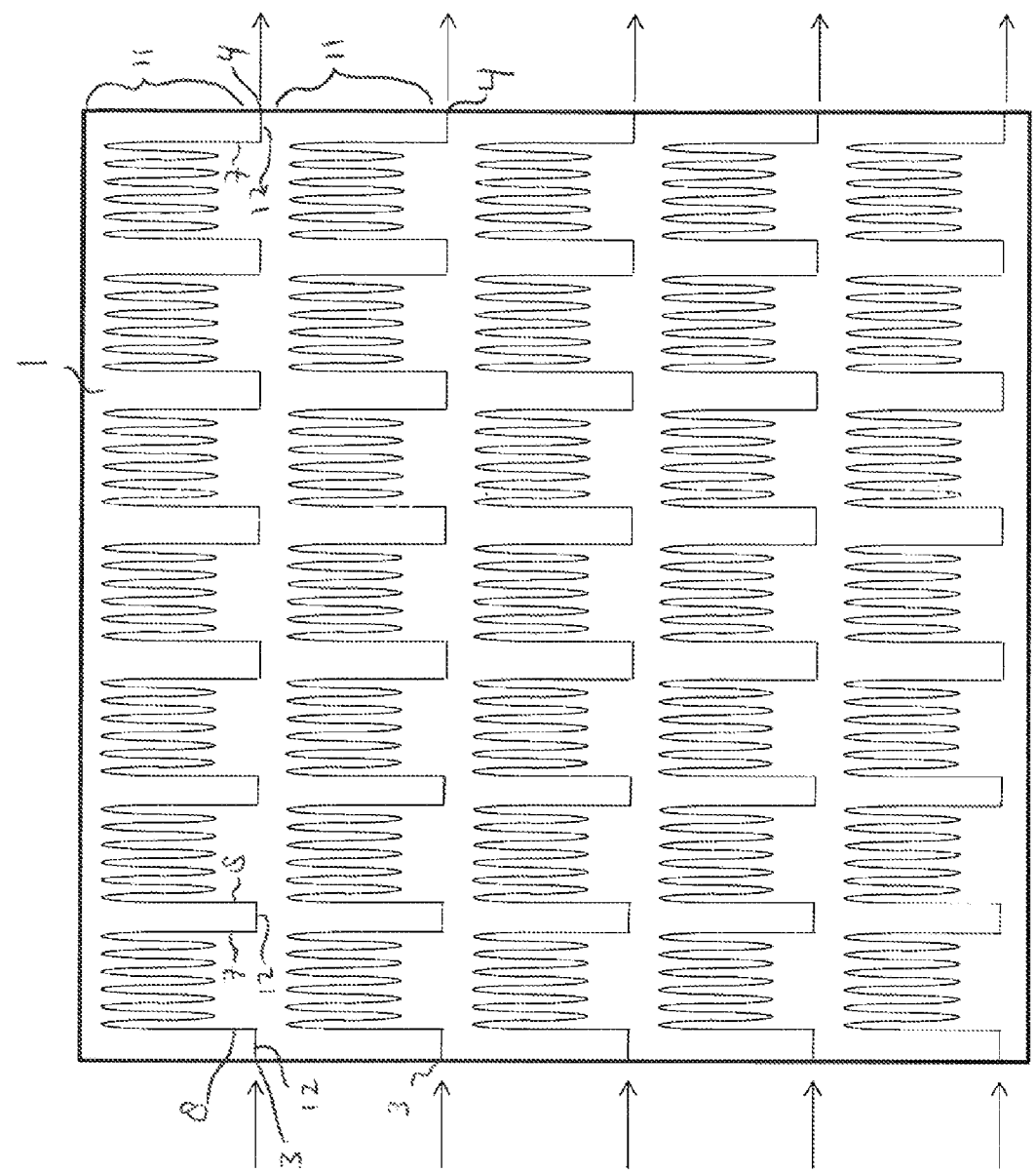

METHOD FOR MANUFACTURING MICROFLUIDIC CHIPS, DEVICE FOR FUNCTIONALIZING MICROFLUIDIC CHIPS, MICROFLUIDIC CHIP AND DEVICE FOR HOLDING A MICROFLUIDIC CHIP

The invention relates to a method for manufacturing microfluidic chips having at least a capillary for throughflow of a fluid. The term "capillary" as used herein denotes a channel having a closed cross-section.

Microfluidic chips are used for various applications, such as micro reactors, micro mixers and cross-capillary chips. Such microfluidic chips are for example manufactured by providing a glass sheet on which channels are etched. These channels are then closed by a second glass sheet which is bonded to the first glass sheet. This provides for a microfluidic chip comprising very small capillaries, which can be used in instruments, which perform analytic tests for example. It is furthermore possible to build such microfluidic chips from glass, ceramics, plastics, silicon or combinations thereof. Instead of etching a channel into the substrate, a channel may also be formed on the substrate by arranging two parts of an intermediate layer in a mutually spaced position. The channel is then defined by the space between these two parts of the intermediate layer. Alternatively, capillaries could be formed within the material from which the microfluidic chips are made. Connections in the microfluidic chips can be provided by holes in one of the sheets or capillaries running to the edges of the microfluidic chips.

After the microfluidic chips are build onto the glass sheet, the glass sheet or wafer is separated into individual microfluidic chips, for example by wet laser cutting or by wet cutting with a saw, a technique known as 'dicing'.

After separating the glass sheet, functionalization of the chips may take place by running a functionalization fluid through the capillaries.

Functionalization of the chips manufactured on a glass sheet takes a lot of time and results accordingly in higher costs. It is now an object of the invention to reduce these disadvantages.

This object is achieved by a method according to the invention of claim 1.

As the microfluidic chips comprise at least one common capillary and the chips are functionalized before separating them from the wafer, it is possible to have a functionalization fluid flow through the at least one common channel or capillary and functionalize the chips, which are part of this common capillary. So, when functionalizing the chips it is possible to connect the at least one common capillary only once and then functionalize a plurality of chips. Only after the chips are functionalized, the wafer is cut into separate parts.

The functionalization fluid may be chosen from, but not restricted thereto, the group comprising organosilicon compounds, hydrophilic coating solutions, hydrophobic coating solutions, grafting solutions, gel-based solutions and protein-based solutions. By functionalizing the shared capillary by running such functionalization fluids therethrough the channel surface of all chips is functionalized by silanization, hydrophilization, hydrophobization, grafting of DNA fragments or synthetic oligoneotides, gel loading for capillary electrophoresis, or immobilization of biomolecules, respectively.

Preferably, step (d) is performed by a dry and/or clean dividing method.

A disadvantage of the commonly used wet dividing methods for cutting the wafer into chips is that the capillaries will fill up with dirt and water. This is especially disadvantageous in the current method, because this may damage the already functionalized capillaries.

These disadvantages are overcome by using a dry and/or clean dividing method.

For example, step (d) is performed by first scratching a scratch line in the starting material and by then breaking the starting material over the scratch line.

Such a dividing technique is clean and dry and thus overcomes said above described disadvantage. The scratch line may for example be made with a (glass) cutting wheel. Such a method is also known as scribing.

In an embodiment of the method according to the invention step (b) is performed by arranging a channel on or in a first layer of the starting material and closing off this channel by arranging a second layer of the starting material thereon. Said channel may for example be provided by etching or sand blasting.

In an embodiment of the method according to the invention said starting material is a sheet material.

In another embodiment of the method according to the invention said starting material is made of a material chosen from the group comprising glass, silicon, plastics and ceramics.

The capillary provided in the wafer could either be a straight capillary or a capillary having a repeating pattern with a pitch corresponding to the pitch of the chips.

In another embodiment of the method according to the invention the starting material comprises at least three layers, wherein at least one shared capillary is formed between a first layer and a second layer of the starting material, and wherein at least one shared capillary is formed between the second layer and a third layer of the starting material.

The wafer with multiple layers is easily functionalized prior to cutting the wafer into chips, such that chips with multiple layers may easily be made. The functionalization fluid for functionalizing the shared capillary between the first layer and the second layer of the starting material may be different from the functionalization fluid for functionalizing the shared capillary between the second layer and the third layer of the starting material, such that the two capillaries each have a different function. Alternatively, the functionalization fluid may be the same for the two capillaries such that the two capillaries will obtain the same function. The shared capillaries may for example be provided by arranging channels on or in opposing main planes of the second layer of the starting material and by closing off these channels by arranging the first and third layers of the starting material thereon.

So with the method according to the invention it is possible to have a plurality of chips functionalized while the at least one common capillary is supplied with a functionalization fluid. It is no longer necessary to reconnect the fluid supply to each and every separate chip.

Step (c) may be performed by supplying a plurality of functionalization fluids to the shared capillary, wherein said plurality of functionalization fluids are supplied subsequently.

By supplying a plurality of functionalization fluids to the shared capillary, in particular if different functionalization fluids are supplied thereto, the shared capillary may obtain a multilayer of functionalities. After supplying a first functionalization fluid to the shared capillary the functionalization fluid may be left to dry or be actively dried before the next functionalization fluid is supplied thereto.

The invention further relates to a device for functionalizing microfluidic chips having at least one capillary for through-flow of a fluid, said device comprising a material holder for holding a starting material in a fixed position during functionalization, said material holder comprising at least one inlet connector for connecting at least one fluidic inlet of at least one shared capillary formed in the starting material to a functionalization fluid supply.

With use of the material holder or wafer holder according to the invention the wafer can easily be held in place during functionalization of the capillary or capillaries. The inlet connector may be arranged at a predetermined location of the material holder such that the shared capillary may be provided in the starting material at a predetermined location corresponding to the location of the inlet connector, such that the connection of the shared capillary to the functionalization fluid supply may easily be provided.

In an embodiment of the device according to the invention the material holder comprises at least one outlet connector for connecting at least one fluidic outlet of at least one shared capillary formed in the starting material to a functionalization fluid collector.

By providing an outlet connector for connecting the fluidic outlet of a shared capillary formed in the starting material to a functionalization fluid collector, excessive functionalization fluid can be collected and optionally reused for functionalizing a next wafer.

For holding the starting material the material holder preferably comprises a recess for receiving said starting material, wherein said inlet connector and/or said outlet connector is arranged in an edge of the material holder.

The starting material may be provided in the recess in such a way that an edge of the starting material comprising an inlet of the shared capillary is adjacent to said edge of the material holder comprising said inlet connector and/or in such a way that an edge of the starting material comprising an outlet of the shared capillary is adjacent to said edge of the material holder comprising said outlet connector, such that the shared capillary may connect to the inlet connector and/or the outlet connector.

The recess may be formed such and/or have a size such that the starting material is clamped or snapped into the recess.

For starting materials comprising multiple layers it is preferred that said material holder comprises at least two inlet connectors and/or at least two outlet connectors for connecting at least two shared capillaries formed in different layers of the starting material to a functionalization fluid supply and/or a functionalization fluid collector.

The invention further relates to a microfluidic chip having at least one functionalized capillary for through-flow of a fluid manufactured by performing the steps of the method according to any of the claims 1-9, said method comprising the steps of:

(a) providing a starting material;

(b) forming at least one shared capillary in the starting material, said shared capillary comprising an fluidic inlet and an fluidic outlet;

(c) functionalizing the chips by supplying a functionalization fluid to the shared capillary; and (d) dividing the starting material into separate chips.

As a result of said shared capillary, which extends parallel to a main plane of the starting material, an inlet and an outlet of the capillary of the chip are arranged in a side edge of the chip. The inlet and outlet may be arranged in the same side edge or in different, for example opposing, side edges. An advantage of the chip manufactured by the method according to the invention comprising said inlet and outlet arranged in a side edge of the chip is that the main planes of the chip, i.e. the upper and lower plane of the chip, remain free of in- and outlets. As a result thereof, the free space(s) of the upper and lower plane can be used for other functionalities, or the chips may be made relatively small.

The chip resulting from the method according to the invention can be held during use by a similar chip holding device as the wafer holding device according to the invention, wherein the size and shape of the chip holding device are adapted to the size and shape of the chip. As such the invention further relates to a device for holding a microfluidic chip according to claim 15 or 16, said chip having at least one functionalized capillary for through-flow of a fluid, comprising a chip holder for holding said chip in a fixed position during use, said chip holder comprising at least one inlet connector for connecting at least one inlet of the at least one functionalized capillary of the chip to a fluid supply and/or at least one outlet connector for connecting at least one outlet of the at least one functionalized capillary of the chip to a fluid collector.

Preferably the chip holder comprises a recess for receiving said chip, wherein said inlet connector and/or said outlet connector is arranged in an edge of the recess of the chip holder.

The recess may be formed such and/or has a size such that the chip can be clamped, glued or snapped in the recess.

For chips comprising multiple layers it is preferred that said chip holder comprises at least two inlet connectors and/or at least two outlet connectors for connecting at least two functionalized capillaries formed in different layers of the chip to a fluid supply and/or a fluid collector.

These and other advantages of the invention will be elucidated with the accompanying drawings.

FIGS. 2A and 2B show the different steps of a second embodiment of the method according to the invention;

FIGS. 3A and 3B show the different steps of a third embodiment of the method according to the invention;

FIGS. 4A-4C show the different steps of a fourth embodiment of the method according to the invention;

FIGS. 6A and 6B show a wafer holder according to the invention, wherein FIG. 6A is a perspective view and FIG. 6B a side view.

Figure 1A:
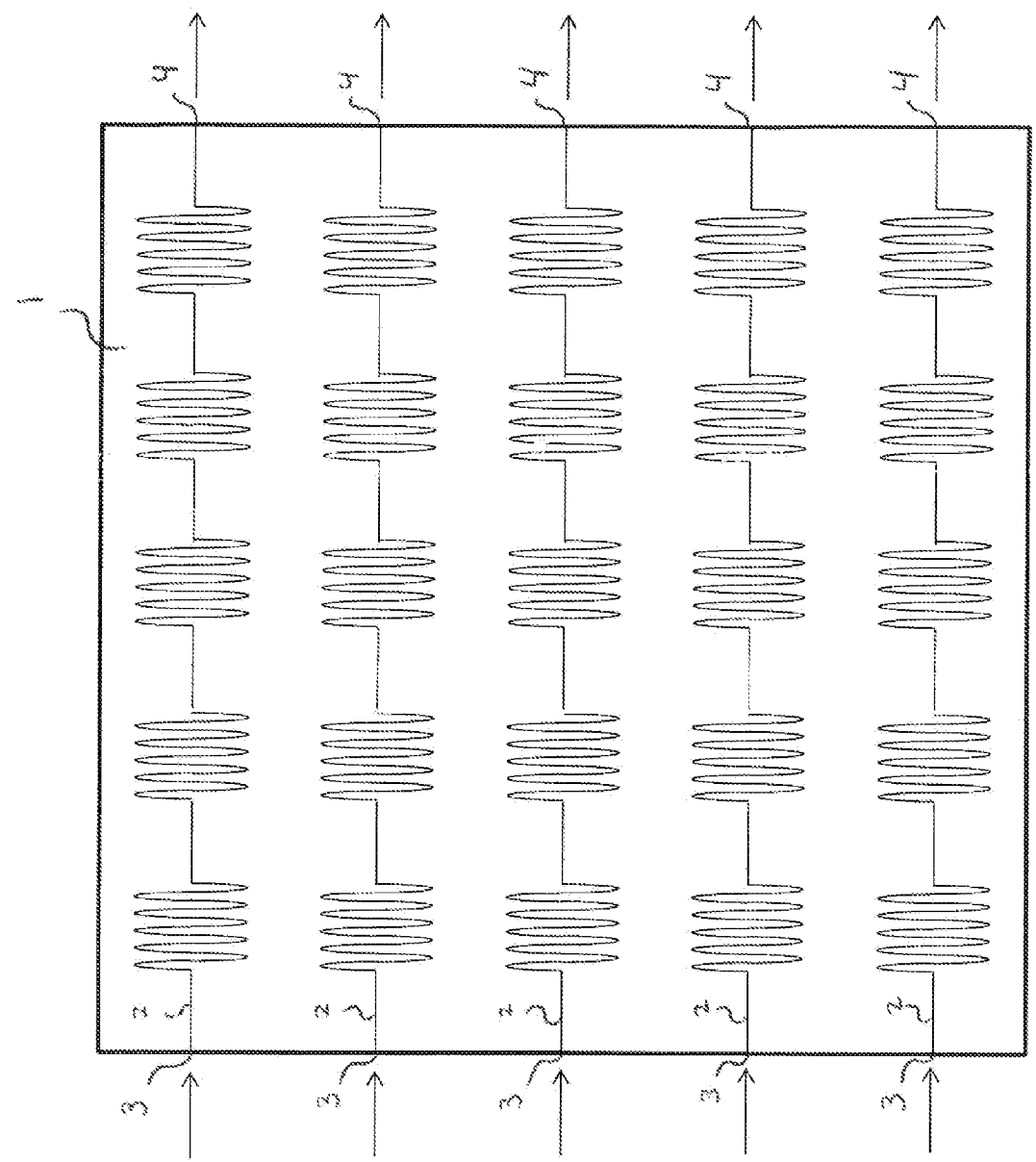
FIGS. 1A-1C show the different steps of a first embodiment of the method according to the invention.
Figure 1B:
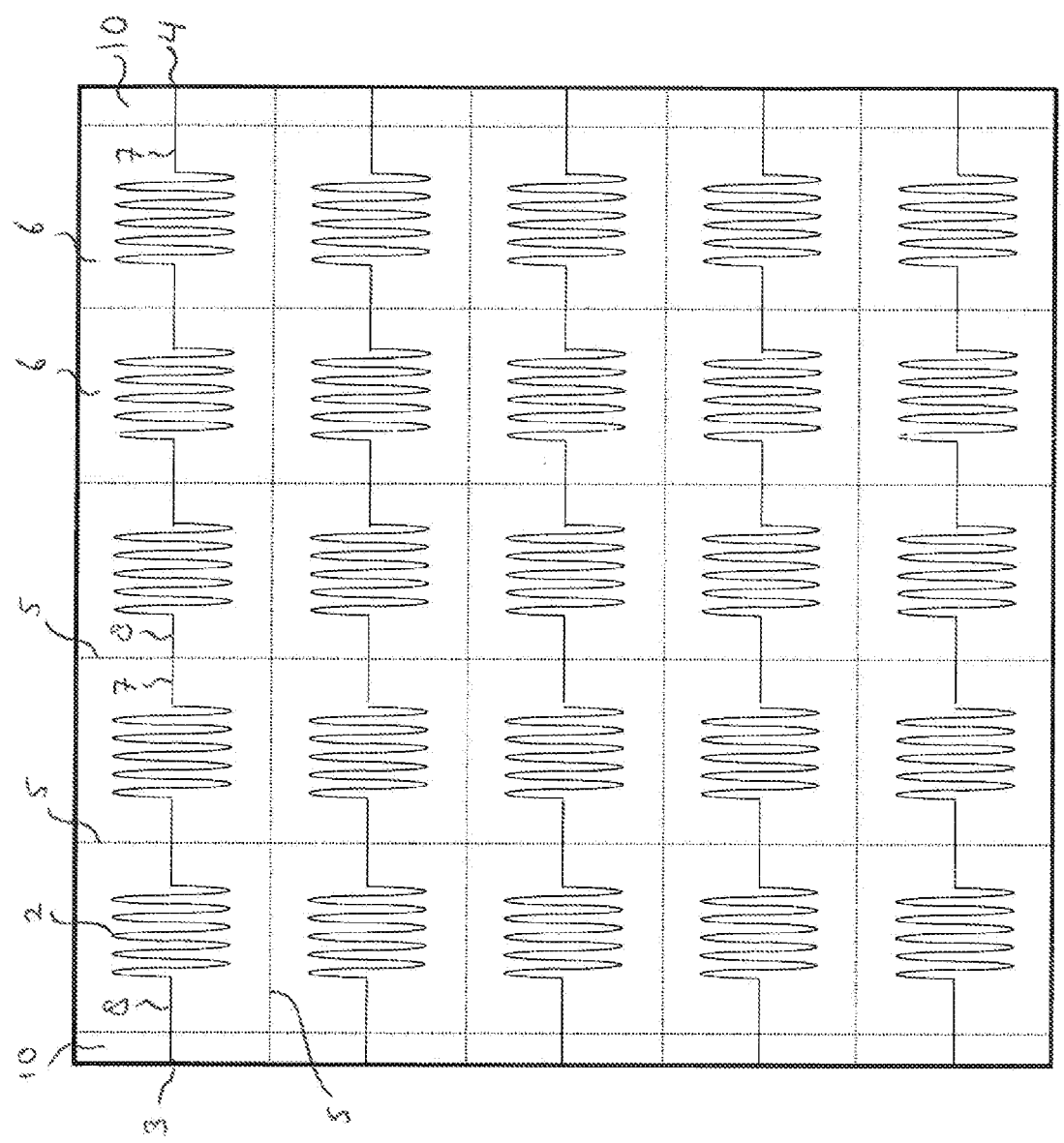

In FIGS. 1A and 1B a wafer 1 is schematically shown in a top view. The wafer 1 is for example made of glass, silicon, plastics or ceramics. In the wafer 1 five separate parallel common capillaries 2 are provided. The shared capillaries 2 have a repeating pattern with a pitch corresponding to the pitch of the chips 6. The capillaries 2 can be provided by for example etching or sand blasting channels in a first layer of sheet material and by subsequently closing off the channels by a second layer of sheet material. Each of the five shared capillaries 2 comprises a fluidic inlet 3 and a fluidic outlet 4.

To the fluidic inlets 3 a fluid supply (not shown) may be connected for supplying a functionalization fluid to the capillaries 2. By running the functionalization fluid through the shared capillaries 2 the chips on the wafer 1 are simultaneously functionalized prior to cutting the chips from the wafer. The shared capillaries 2 are formed in the wafer 1 such that an outlet 7 of a first chip 6 is connected to an inlet 8 of an adjacent chip 7, see FIG. 1B. The functionalization fluid exits the shared capillaries 2 via the fluidic outlets 4. The fluidic outlets 4 may for example be connected to a fluid collector for collecting the functionalization fluid.

After functionalizing the shared capillaries 2 of the wafer 1 the wafer 1 is cut into twenty five microfluidic chips 6 by cutting the wafer 1 over separation lines 5, see FIG. 1B. The separation lines 5 are for example scratch lines that are formed in the wafer 1 and that form weakened portions of the wafer 1, so that the wafer may be broken into the twenty five chips 6 over the scratch lines 5. The scratch lines 5 may be provided by cutting the scratch lines in the outer surface of the wafer 1 by means of a (glass) cutting wheel. This method of dividing the wafer 1 is also called scribing, which is a dry and clean technique, such that the functionalized capillaries of the microfluidic chips 6 are not damaged. As is clear from FIG. 1B, at both connecting sides of the wafer 1 a part 10 of wafer material is lost, which part 10 comprises the fluidic inlets 3 and fluidic outlets 4 of the shared capillaries 2. The method according to the inventions saves such an amount of time, that this loss of material is considered acceptable. Alternatively the fluidic inlets 3 may be formed by the inlets 8 of the chips 6 arranged closest to the fluidic inlets 3 and the fluidic outlets 4 may be formed by the outlets 7 of the chips 6 arranged closest to the fluidic outlets 4, such that parts 10 are not required and no loss of material occurs.

Figure 1C:
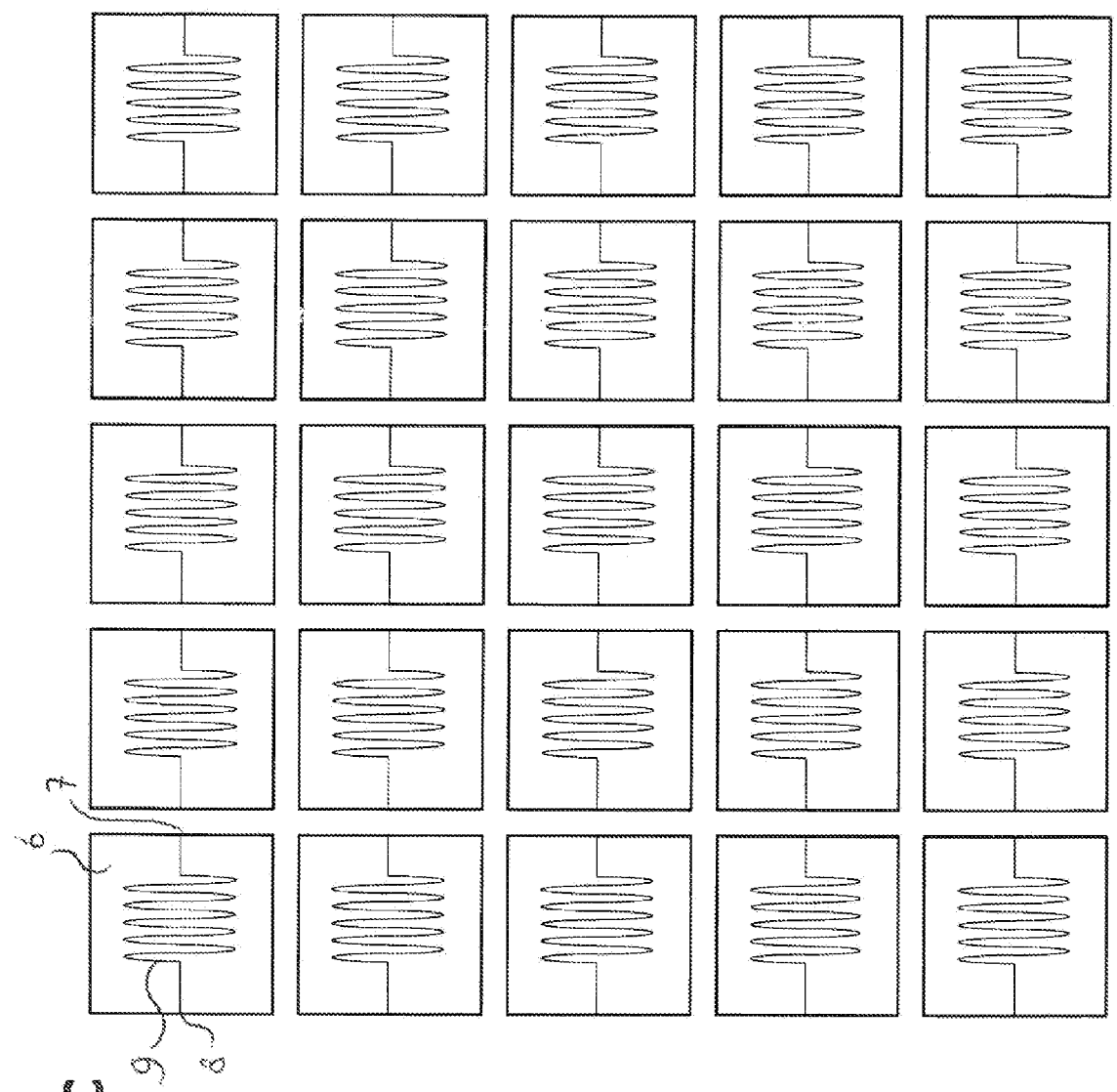

FIG. 1C shows the twenty five chips 6 resulting from the divided wafer 1 of FIGS. 1A and 1B. Each of the chips 6 has a functionalized capillary 9 comprising a part of the shared capillary 2 of the wafer 1. As is clearly shown in FIG. 1C, the inlets 8 and outlets 7 of the chips 6 are arranged in two opposing side edges of each chip 6, and not in the upper or lower planes thereof.

Figure 2A:
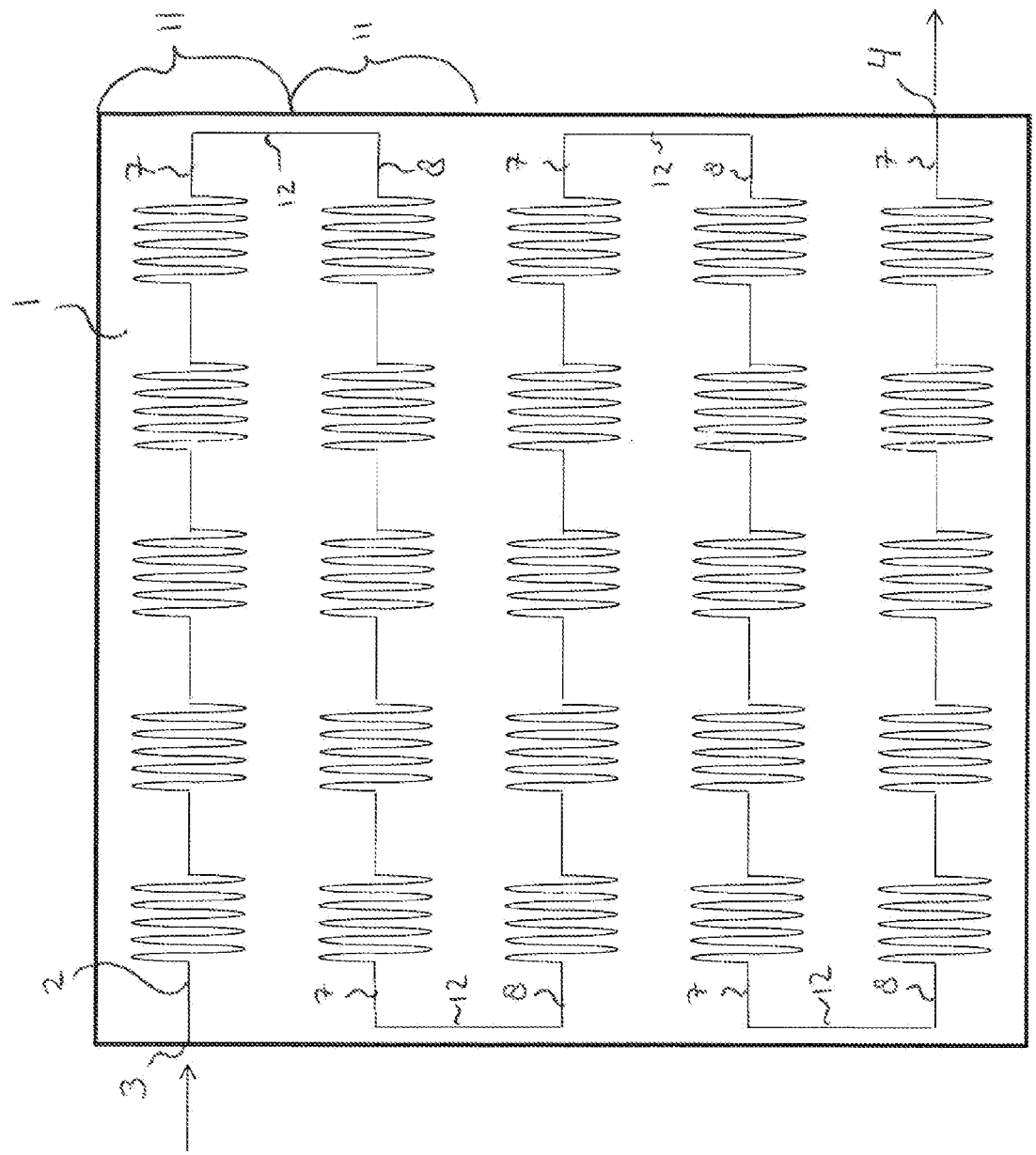

The second embodiment of the method shown in FIGS. 2A and 2B differs from the method of FIGS. 1A-1C in that only one fluidic inlet 3 and only one fluidic outlet 4 is provided, and in that the twenty five chips all comprise one shared capillary 2. The outlet 7 of each last chip 6 of each of the first four rows 11 of microfluidic chips 6 is connected to the inlet 8 of each first chip 6 of the next row 11 via a connecting part 12 of the shared capillary 2. Last and first are defined here in the direction of fluid flow, such that the last and first chips 6 are provided alternatingly on two opposing end zones of the wafer 1. Because only one fluidic inlet 3 and only one fluidic outlet 4 is provided only one connection with a fluid supply and only one connection with a fluid collector has to be provided. FIG. 2B shows that the parts 10 of lost material comprise the connecting parts 12 of the shared capillary 2. After cutting the wafer 1 of FIGS. 2A and 2B over the separation lines 5 shown in FIG. 2B the resulting chips 6 are the same as shown in FIG. 1C.

It is noted that only the differences with respect to the first embodiment of FIGS. 1A-1C are described. For a further explanation of FIGS. 2A and 2B the reader is referred to the description of FIGS. 1A-1C.

Figure 3B:
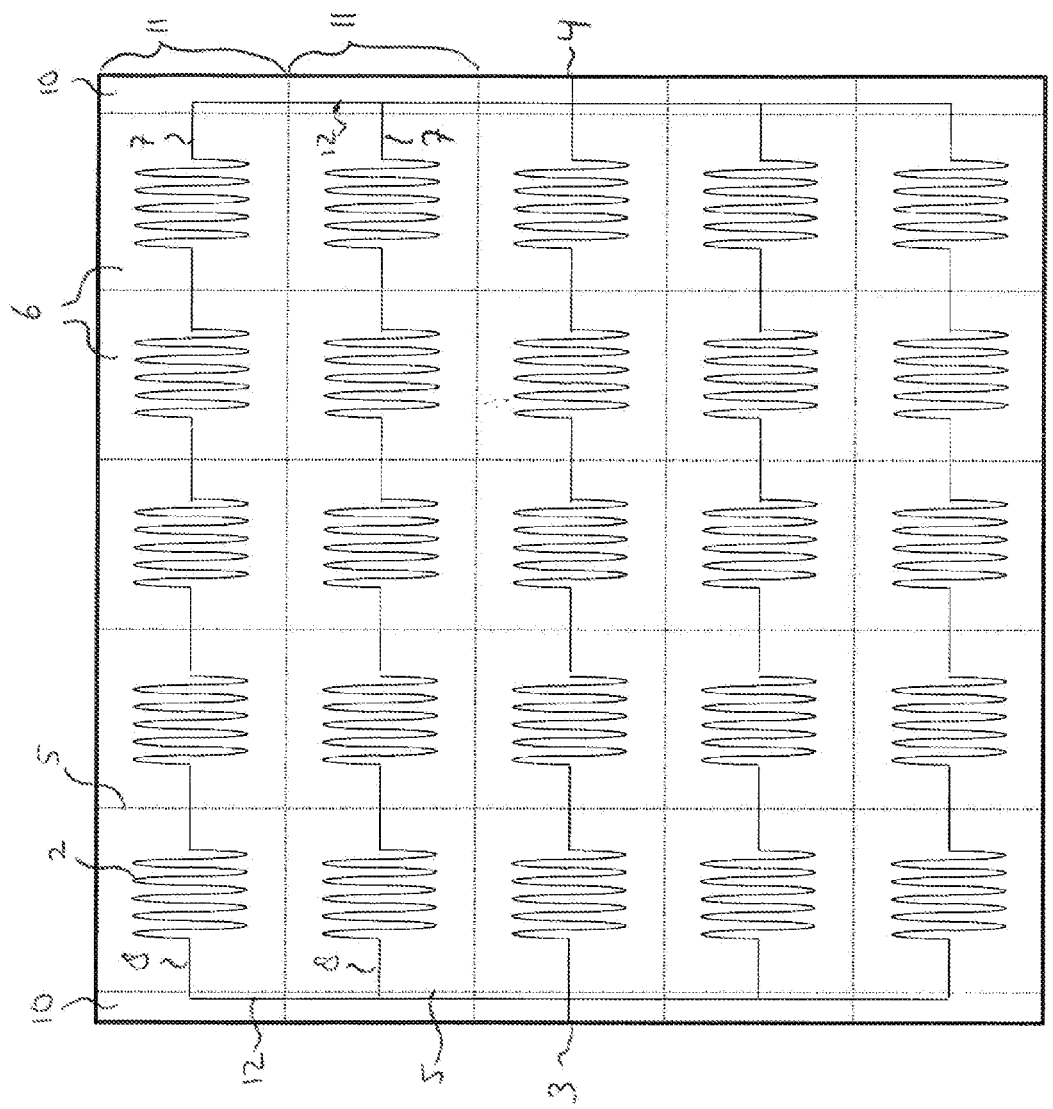

The third embodiment of the method shown in FIGS. 3A and 3B differs from the method of FIGS. 1A-1C in that only one fluidic inlet 3 and only one fluidic outlet 4 is provided. Each row 11 of microfluidic chips 6 comprises one shared capillary 2, such that in total five shared capillaries 2 are provided for the twenty five chips. The five shared capillaries 2 are all connected to the one fluidic inlet 3 and the one fluidic outlet 4 via connecting parts 12 of the shared capillaries 2. A first connecting part 12 extends between the inlets 8 of the first chip 6 of each row 11 and a second connecting part 12 extends between the outlets 7 of the last chip 6 of each row 11. First and last are defined here in the direction of fluid flow. Because only one fluidic inlet 3 and only one fluidic outlet 4 is provided only one connection with a fluid supply and only one connection with a fluid collector has to be provided. FIG. 3B shows that the parts 10 of lost material comprise the first and second connecting parts 12 of the shared capillaries 2. After cutting the wafer 1 of FIGS. 3A and 3B over the separation lines 5 shown in FIG. 3B the resulting chips 6 are the same as shown in FIG. 1C. It is noted that only the differences with respect to the first embodiment of FIGS. 1A-1C are described. For a further explanation of FIGS. 3A and 3B the reader is referred to the description of FIGS. 1A-1C.

Figure 4B:
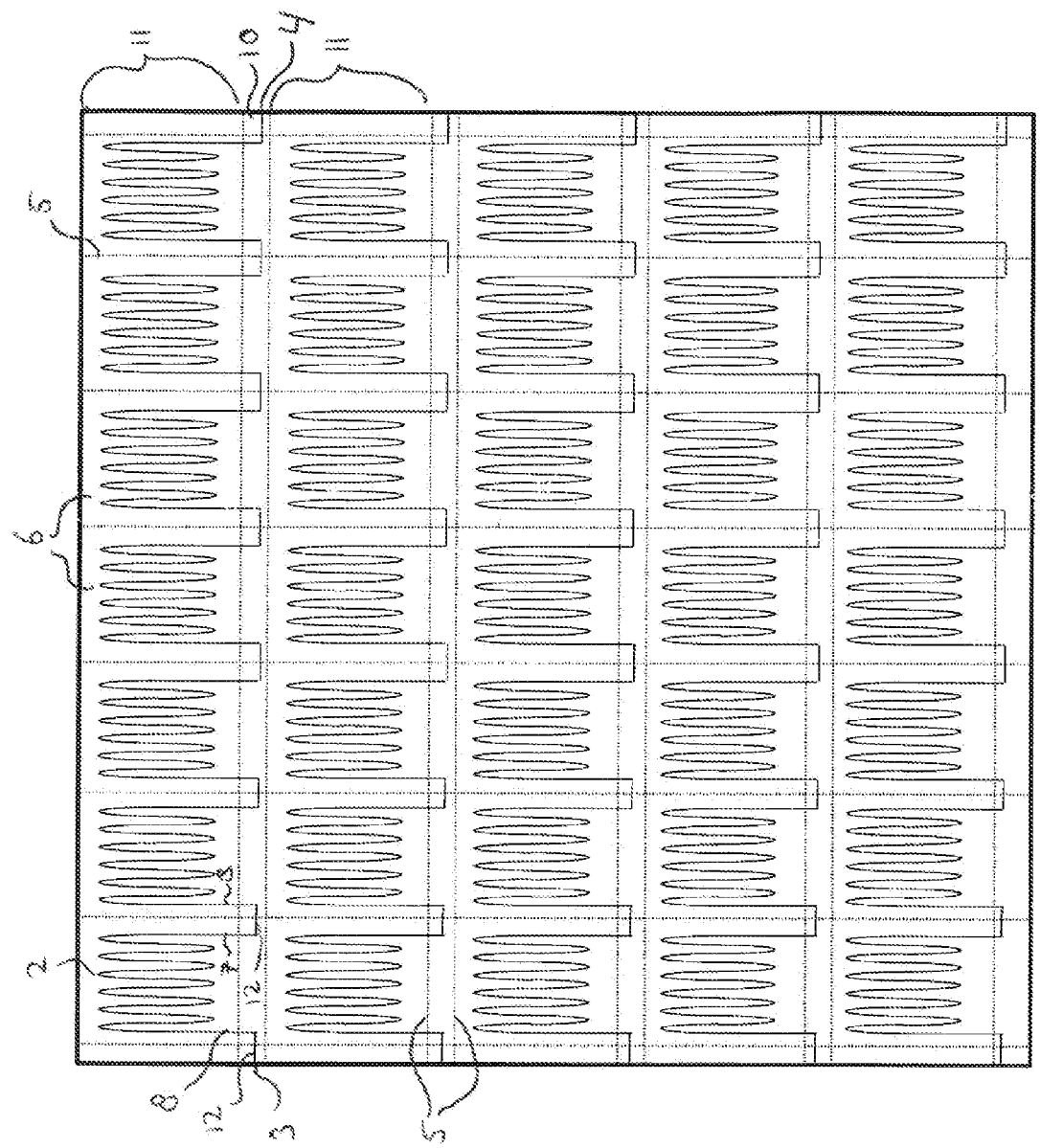
Figure 4C:
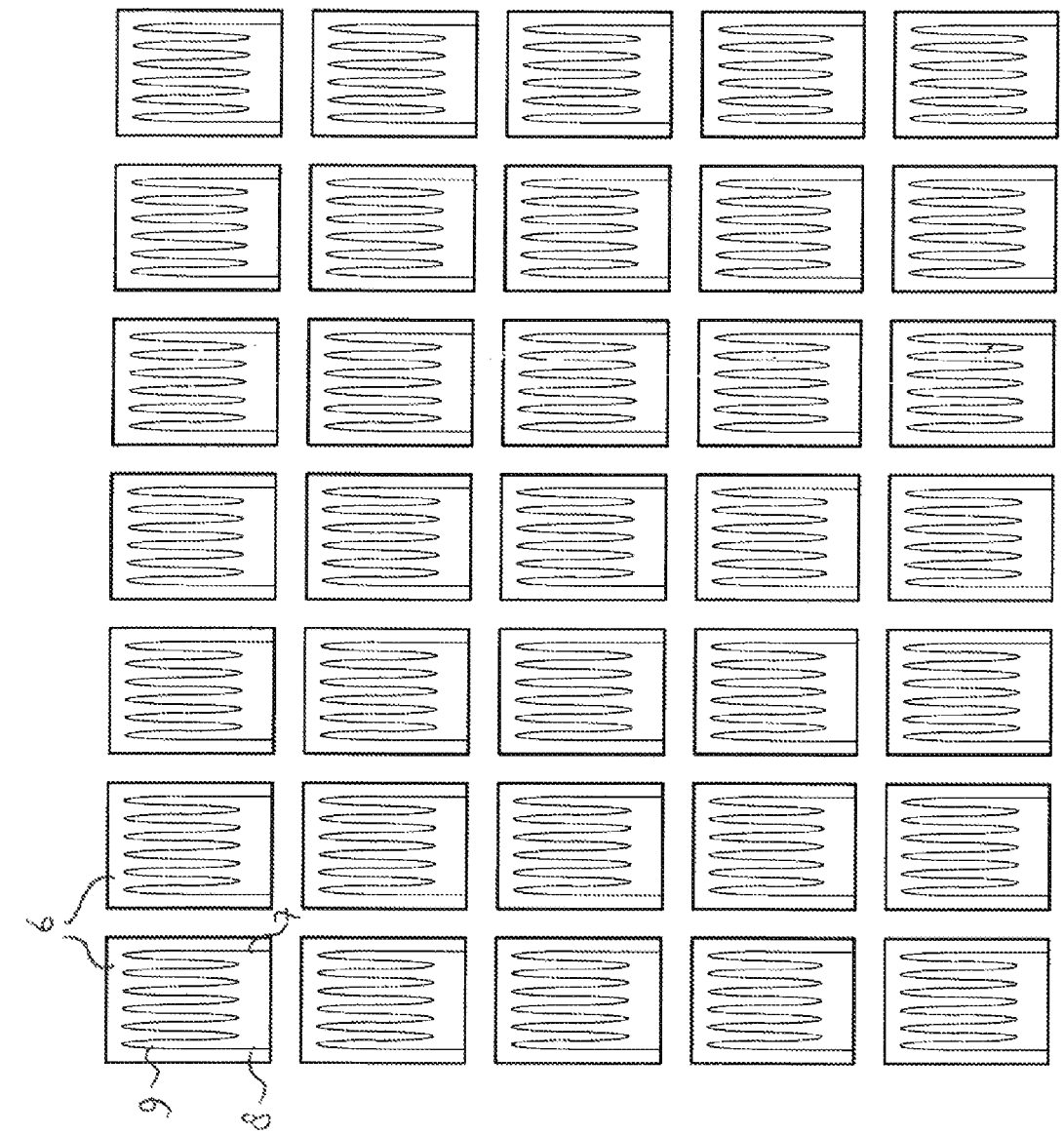

The fourth embodiment of the method shown in FIGS. 4A-4C differs from the method of FIGS. 1A-1C in that the directions of the inlets 8 and outlets 7 of the chips 6 are orthogonal to the longitudinal direction of each row 11 of chips 6. Due to these opposing directions a connecting part 12 of the shared capillaries 2 extending parallel to the longitudinal direction of each row 11 has to be provided between each outlet 7 of a first chip 6 and an inlet 8 of a successive chip. Also, a first connecting part 12 is provided between the inlet 8 of each first chip 6 of each row 11 and the fluidic inlet 3 of each row 11 and a second connecting part 12 is provided between the outlet 7 of each last chip 6 of each row 11 and the fluidic outlet 4 of each row 11. First, last and successive are defined here in the direction of fluid flow. Due to the presence of the connecting parts 12 extending between each outlet 7 of a chip 6 and an inlet 8 of the successive chip 6, parts 10 of wafer material comprising the connecting parts 12 are lost between two adjacent rows 11 of chips 6, see FIG. 4B. The parts 10 comprising the connecting parts 12 are defined by two separation lines 5 extending parallel with respect to each other between each two adjacent rows 11 of chips 6. The side parts 10 comprising the first and second connecting parts 10 are also lost. The method according to the inventions saves such an amount of time, that this loss of material is considered acceptable. A further difference with respect to the method of FIGS. 1A-1C is that each row 11 comprises seven chips 6 instead of five chips. This is clearly shown in FIG. 4C, which shows the thirty five chips 6 resulting from the wafer 1 after dividing the wafer 1 over the separation lines 5. As is further clearly shown in FIG. 4C, the inlets 8 and outlets 7 of the chips 6 are arranged in one side edge of each chip 6, and not in the upper or lower planes thereof.

It is noted that only the differences with respect to the first embodiment of FIGS. 1A-1C are described. For a further explanation of FIGS. 4A-4C the reader is referred to the description of FIGS. 1A-1C.

Figure 5A:
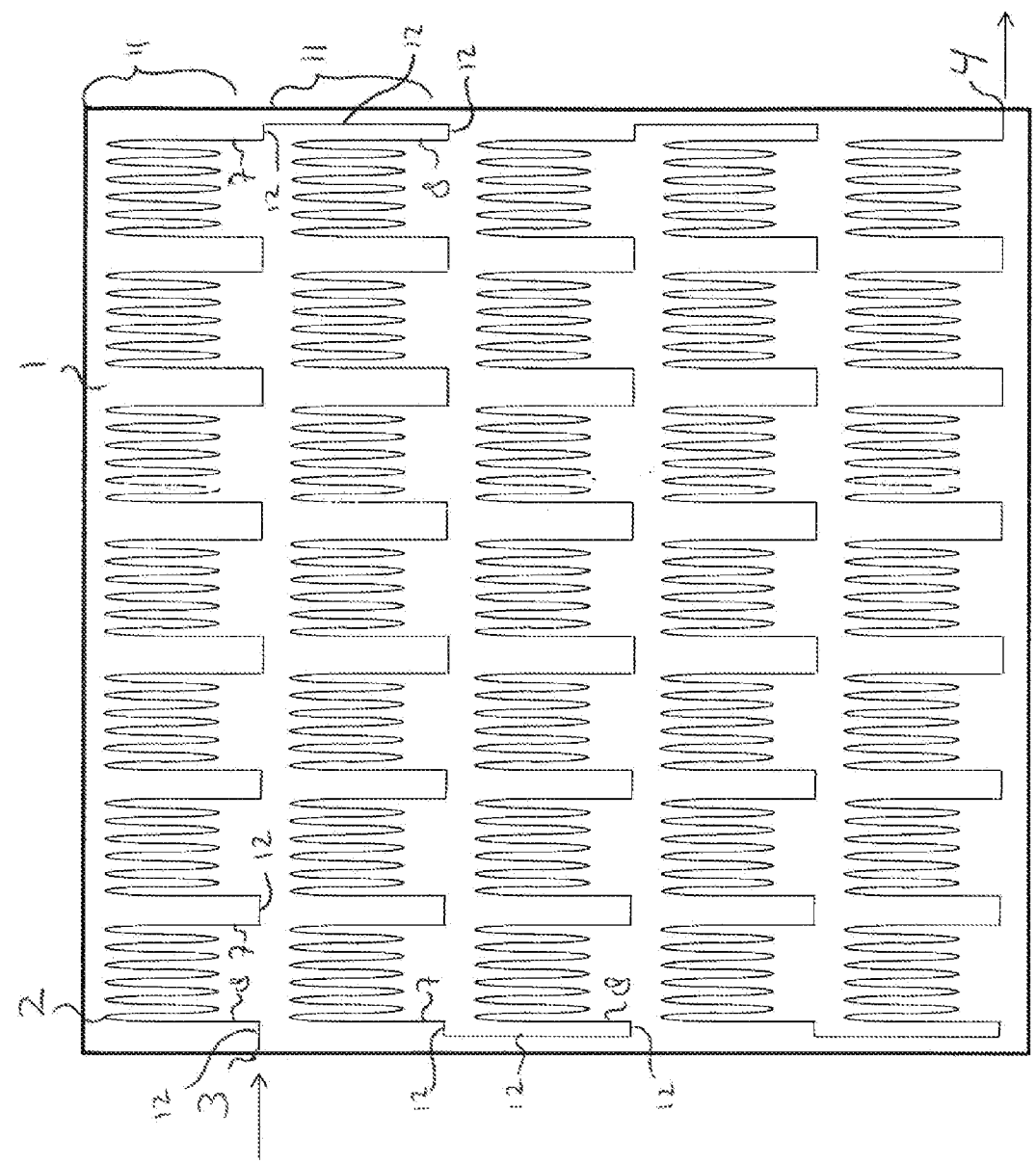
FIGS. 5A and 5B show the different steps of a fifth embodiment of the method according to the invention
Figure 5B:
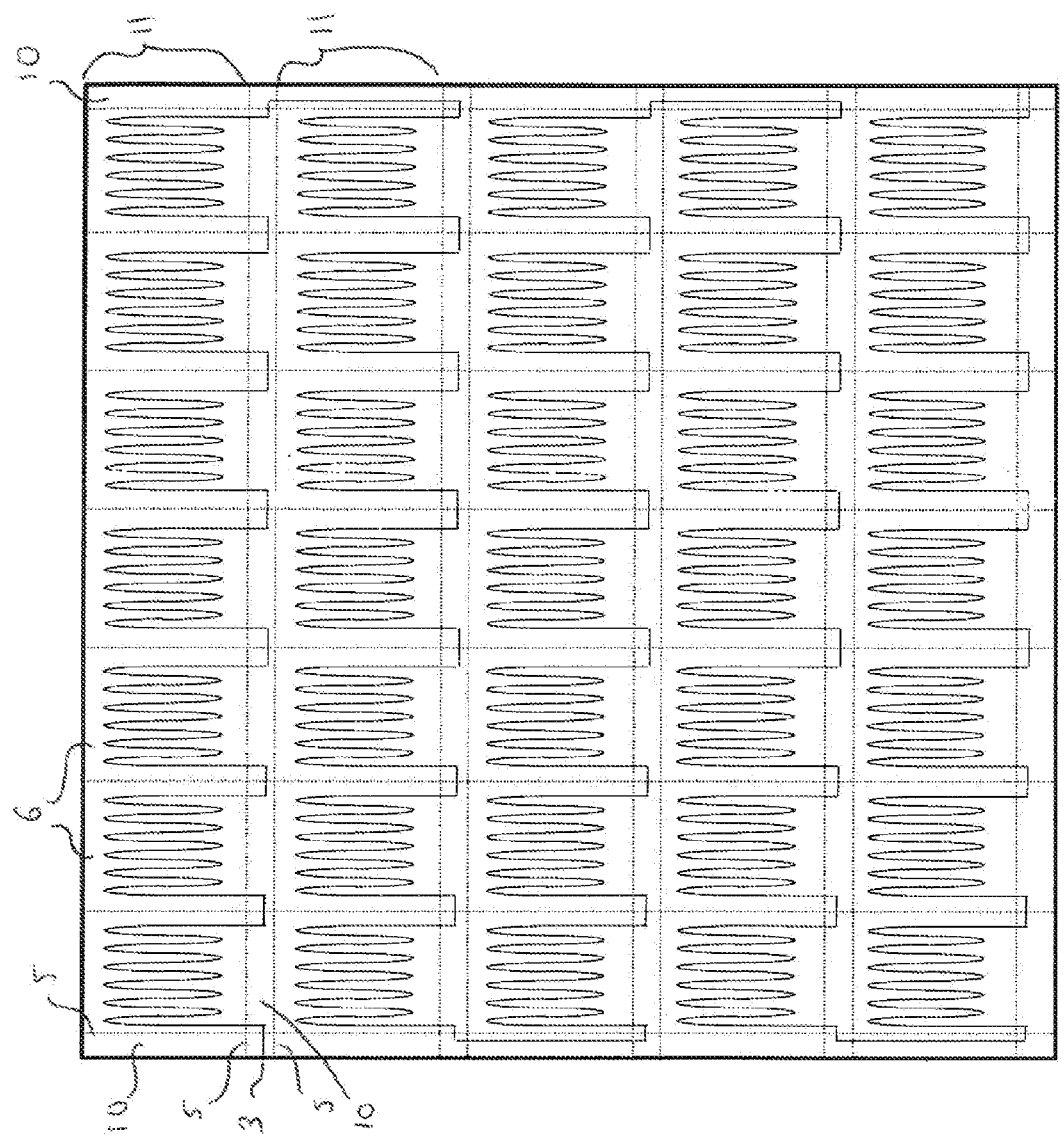

The fifth embodiment of the method shown in FIGS. 5A and 5B is a combination of the second and fourth embodiment of the method according to the invention. The fifth embodiment thus differs from the method of FIGS. 1A-1C in that only one fluidic inlet 3 and only one fluidic outlet 4 is provided, and in that all the chips 6 of the wafer 1 comprise one shared capillary 2. The outlet 7 of each last chip 6 of each of the first four rows 11 of microfluidic chips 6 is connected to the inlet 8 of each first chip 6 of the next row 11 via a connecting part 12 of the shared capillary 2. In addition, the fifth embodiment thus differs from the method of FIGS. 1A-1C in that the direction of the inlets 8 and outlets 7 of the chips 6 is orthogonal to the longitudinal direction of each row 11 of chips 6. Due to these opposing directions connecting parts 12 of the shared capillary 2 extending parallel to the longitudinal direction of each row 11 have to be provided between each outlet 7 of a first chip 6 and an inlet 8 of a successive chip. Also, a first connecting part 12 is provided between the inlet 8 of the first chip 6 of the first row 11 and the one fluidic inlet 3 and a second connecting part 12 is provided between the outlet 7 of the last chip 6 of the last row 11 and the one fluidic outlet 4. First, last and successive are defined here in the direction of fluid flow. Because only one fluidic inlet 3 and only one fluidic outlet 4 is provided only one connection with a fluid supply and only one connection with a fluid collector has to be provided. Due to the presence of the connecting parts 12 extending between each outlet 7 of a chip 6 and an inlet 8 of the successive chip 6, parts 10 of wafer material comprising the connecting parts 12 are lost between two adjacent rows 11 of chips 6. The parts 10 comprising the connecting parts 12 are defined by two separation lines 5 extending parallel with respect to each other between each two adjacent rows 11 of chips 6, see FIG. 5B. The side parts 10 comprising the first and second connecting parts 12 are also lost. The method according to the inventions saves such an amount of time, that this loss of material is considered acceptable. A further difference with respect to the method of FIGS. 1A-1C is that each row 11 comprises seven chips 6 instead of five chips. After cutting the wafer 1 of FIGS. 5A and 5B over the separation lines 5 shown in FIG. 5B the resulting chips 6 are the same as shown in FIG. 4C, see also the description relating to FIG. 4C.

It is noted that only the differences with respect to the first embodiment of FIGS. 1A-1C are described. For a further explanation of FIGS. 5A and 5B the reader is referred to the description of FIGS. 1A-1C.

Figure 6A:
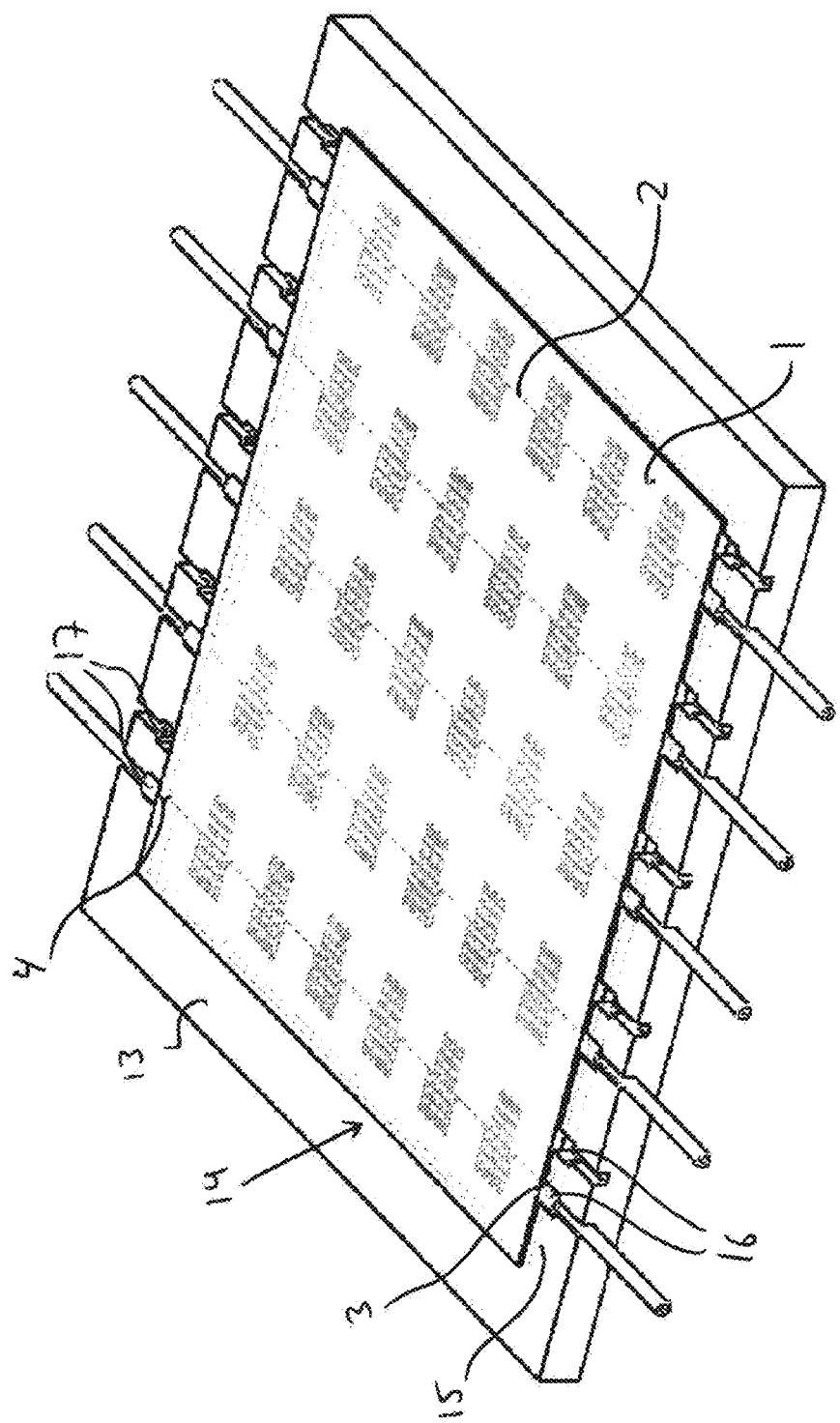
Figure 6B:
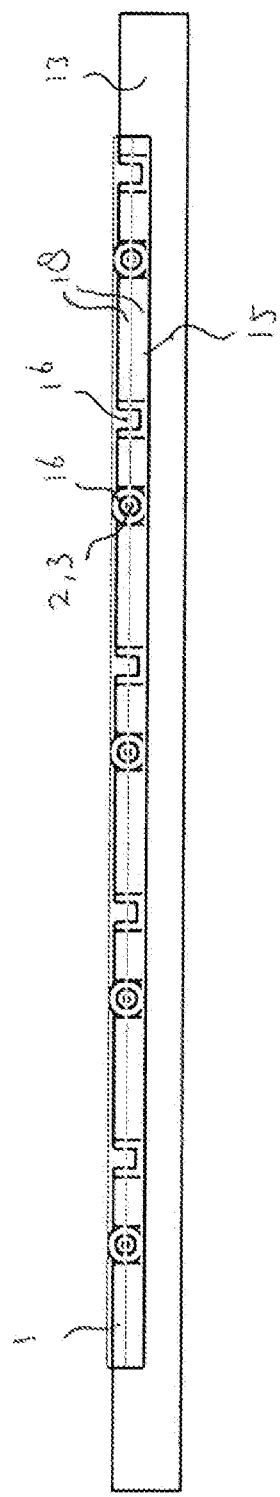

FIGS. 6A and 6B show a wafer holder 13 holding the wafer 1 of FIG. 1A during supplying of the functionalization fluid to the shared capillaries 2. The wafer holder 13 comprises a recess 14 in which the wafer 1 is received. The wafer 1 may be firmly held in the recess 14 by clamping or snapping the wafer 1 in the recess 14. The circumferential edges 15 of the wafer holder 13 comprise a plurality of inlet connectors 16 that are arranged at predetermined locations and a plurality of outlet connectors 17 that are arranged at predetermined locations. The fluidic inlets 3 provided in the edge of the wafer 1 connect to a part of the inlet connectors 16 and the fluidic outlets 4 provided in the opposing edge of the wafer 1 connect to a part of the outlet connectors 17. In particular, the fluidic inlets 3 connect to those inlet connectors 16 that are in register therewith after mounting the wafer 1 in the recess 14 and the fluidic outlets 4 connect to those outlet connectors 17 that are in register therewith after mounting the wafer 1 in the recess 14. The inlet connectors 16 are connected to a functionalization fluid supply (not shown) for supplying functionalization fluid to the shared capillaries 2 via the fluidic inlets 3 of the wafer 1. The outlet connectors 17 are connected to a functionalization fluid collector (not shown) for collecting functionalization fluid discharged from the shared capillaries 2 via the fluidic outlets 4 of the wafer 1.

Figure 7:
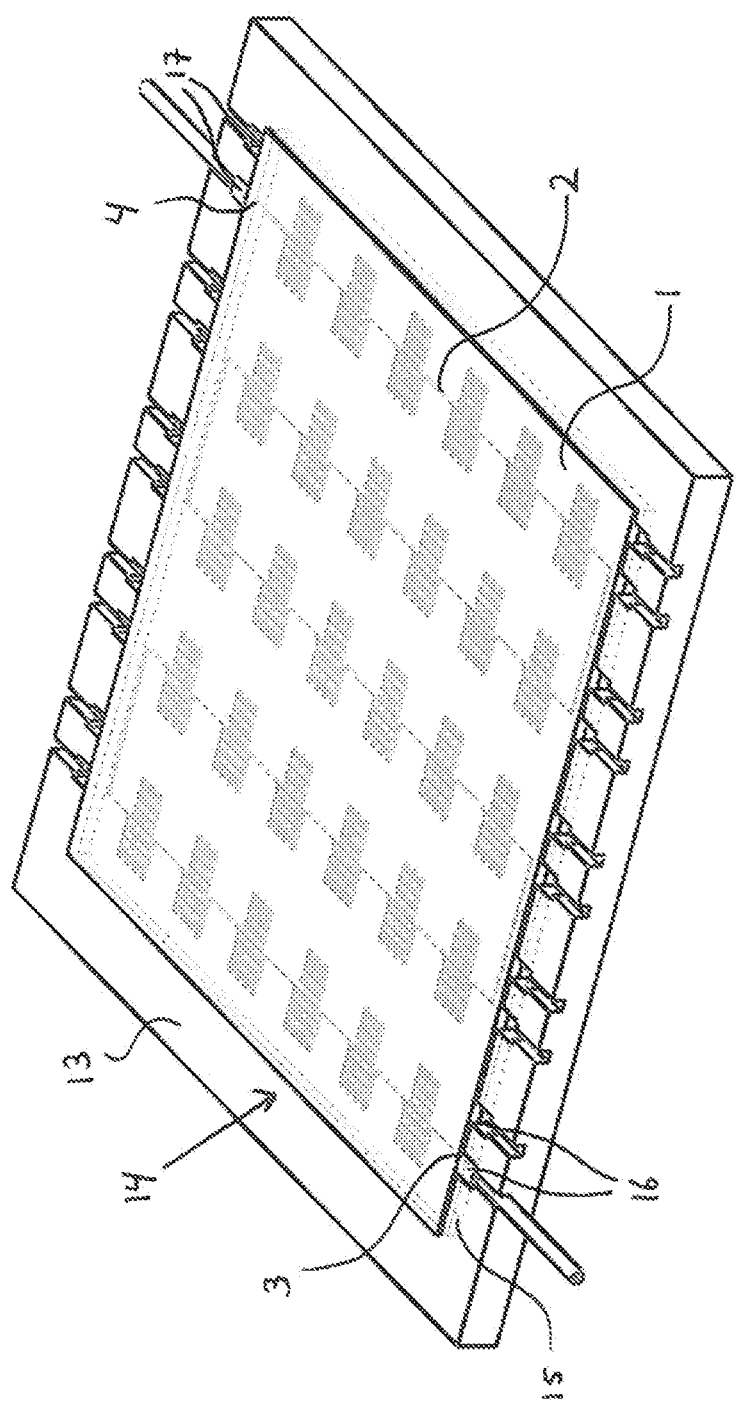
FIG. 7 shows the wafer holder according to FIG. 6A holding the wafer of FIG. 2A.
Figure 8:
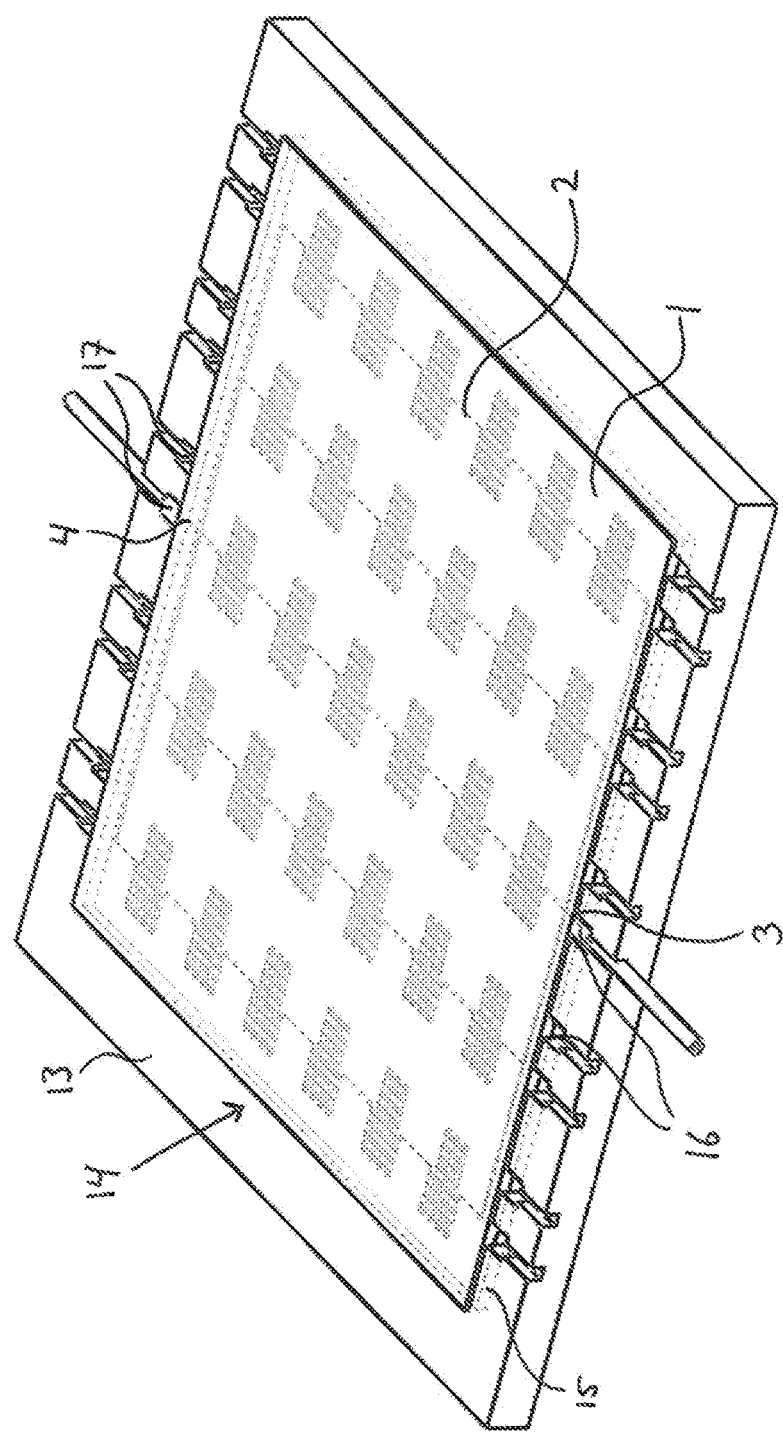
FIG. 8 shows the wafer holder according to FIG. 6A holding the wafer of FIG. 3A.
Figure 9:
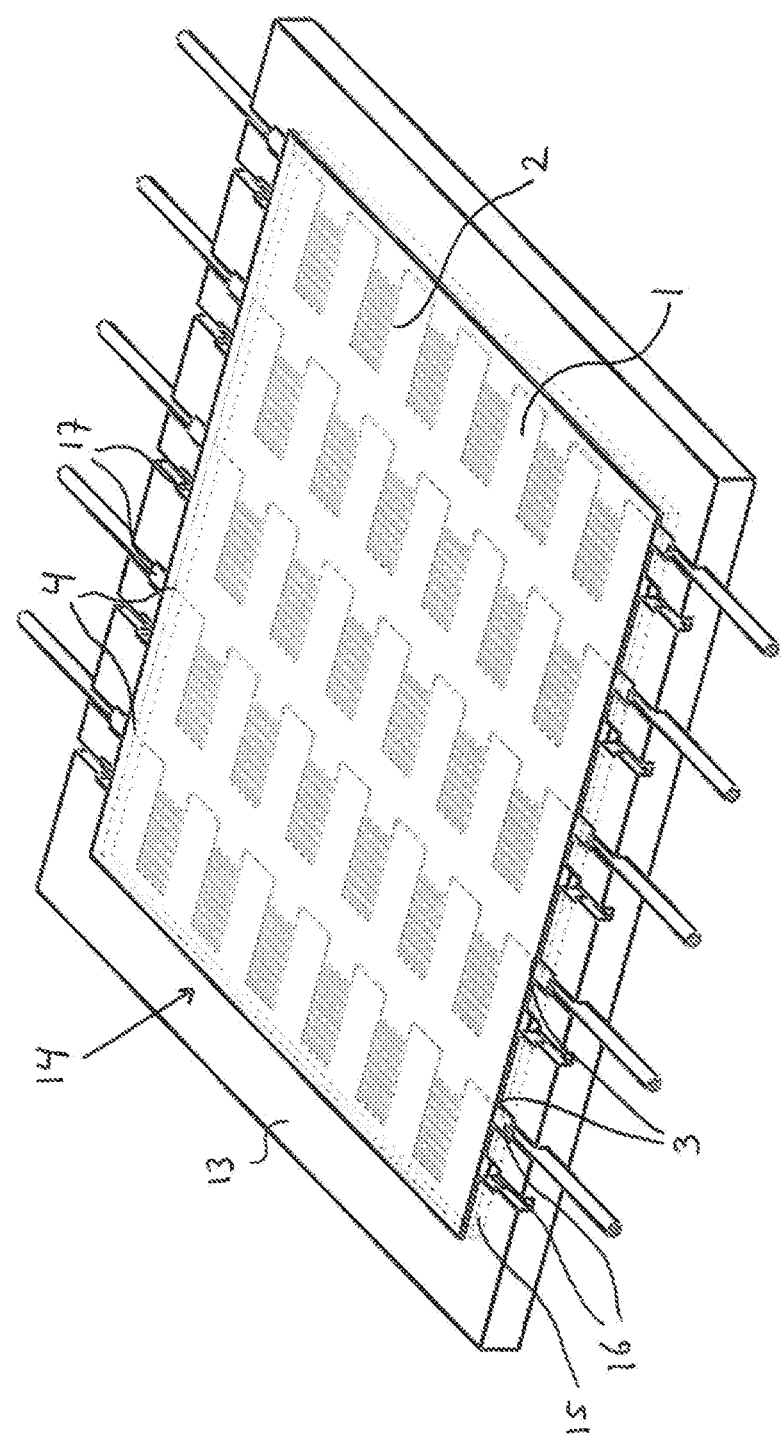
FIG. 9 shows the wafer holder according to FIG. 6A holding the wafer of FIG. 4A.
Figure 10:
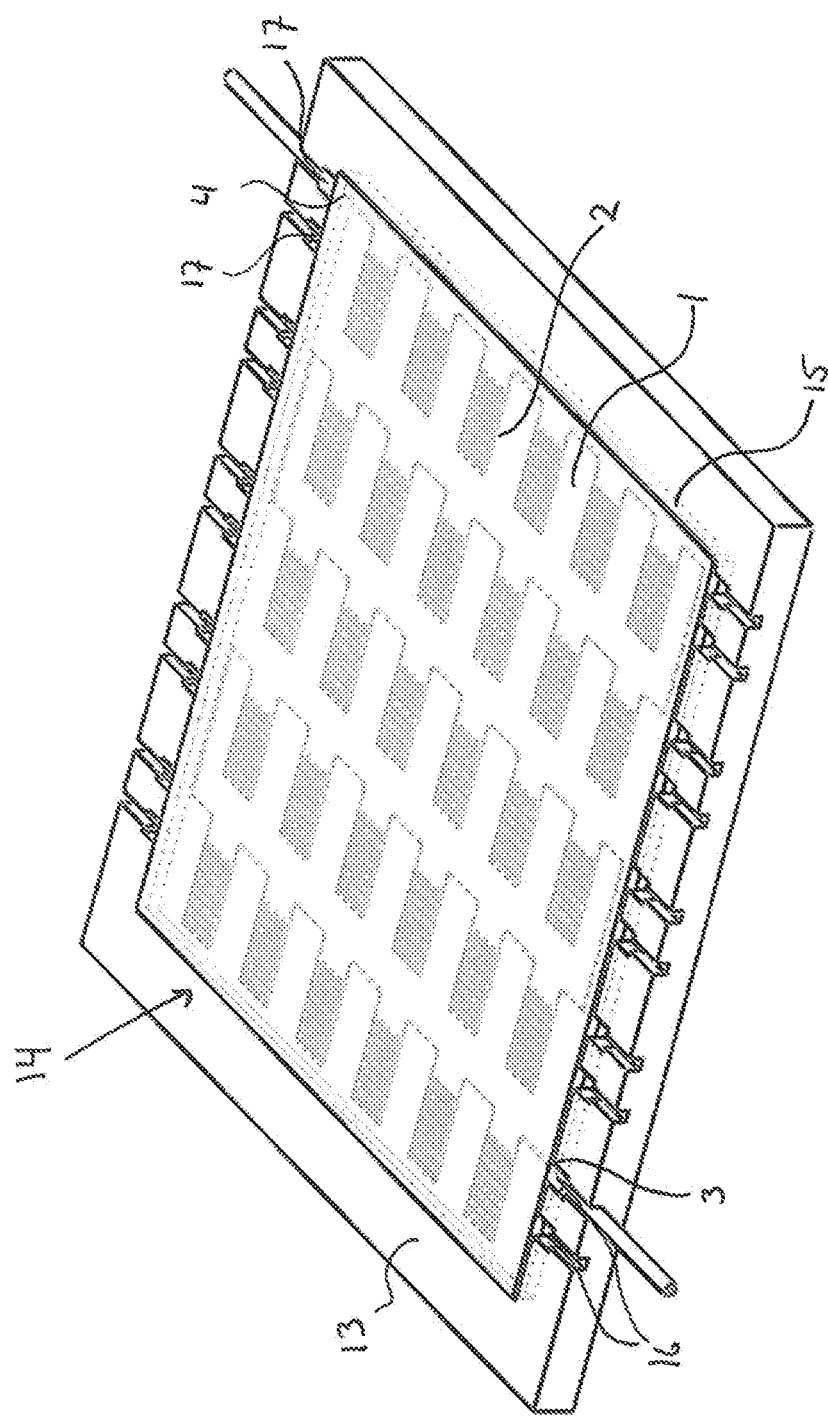
FIG. 10 shows the wafer holder according to FIG. 6A holding the wafer of FIG. 5A.

The wafer holder 13 is suitable for holding all the wafers 1 of the FIGS. 1-5 if the wafers 1 have substantially the same size, even if less fluidic inlets 3 and fluidic outlets 4 are provided or even if the fluidic inlets 3 and fluidic outlets 4 are arranged at different locations. Also in that case only the inlet collectors 16 and outlet collectors 17 that are in register with a fluidic inlet 3 or a fluidic outlet 4 of the wafer 1 are connected and the other inlet collectors 16 and other outlet collectors 17 are not used for that particular wafer 1. In particular, FIG. 7 shows the wafer holder 13 holding the wafer of FIG. 2A, FIG. 8 shows the wafer holder 13 holding the wafer of FIG. 3A, FIG. 9 shows the wafer holder 13 holding the wafer of FIG. 4A, and FIG. 10 shows the wafer holder 13 holding the wafer of FIG. 5A.

Optionally a wafer holder 13 comprising less, for example five, inlet connectors 16 and outlet connectors 17 may be provided. The location of the connectors may be adapted to one type of wafer, for example the wafer 1 of FIG. 1A, wherein the location of the fluidic inlets 3 or fluidic outlets 4 of other wafers, for example the wafer shown in FIG. 4A, may be adapted thereto by arranging the shared capillaries 2 and thereby the fluidic inlets 3 and fluidic outlets 4 in accordance with the locations of the inlet and outlet connectors 16, 17.

As is further shown in FIG. 6B, the wafer 1 comprises two layers 18 of starting material that are bonded together, wherein the capillaries 2 are formed between the two layers 18.

In a second embodiment of the wafer holder 13 (not shown), the inlet connectors 16 and outlet connectors 17 maybe arranged at different heights of the edge of the recess 14 and the recess 14 may have an increased depth. As a result thereof, the wafer holder 13 is suitable for holding wafers 1 with multiple layers 18, in particular three or more layers, wherein the shared capillaries 2 are formed between different adjacent layers 18.

Although the invention has been illustrated by way of an exemplary embodiment, it is not intended to be limited thereto. Many variations and modifications are conceivable.

For example, the wafer may comprise any number of layers and/or any number of shared capillaries and/or any number of chips. Also, the flow direction of the fluid flowing through the shared capillaries 2 and/or the capillary 9 of a chip 6 may be reversed, such that a (fluidic) inlet is used as a (fluidic) outlet.

Consequently, the scope of the invention is defined solely by the following claims.

The invention claimed is:
1. A method for manufacturing microfluidic chips having at least one capillary for through-flow of a fluid, the method comprising:
   (a) providing a starting material;
   (b) forming at least one shared capillary in the starting material, said shared capillary comprising a fluidic inlet and a fluidic outlet, wherein multiple rows of chips are connected to the fluidic inlet and the fluidic outlet, each row of the multiple rows of chips comprising multiple chips that are mutually connected;
   (c) functionalizing the at least one shared capillary of the chips by supplying a functionalization fluid to the at least one shared capillary;
   (d) dividing the starting material into separate chips, wherein each of the chips has a functionalized capillary comprising a part of the shared capillary; and
   (e) removing from at least some of the separate chips portions comprising connecting parts of the at least one shared capillary that mutually connect the multiple rows.
2. The method according to claim 1, wherein step (d) is performed by a dry and/or clean dividing method.

3. The method according to claim 2, wherein step (d) is performed by first scratching a scratch line in the starting material and by then breaking the starting material over the scratch line.

4. The method as claimed in claim 1, wherein step (b) is performed by arranging a channel on or in a first layer of the starting material and closing off this channel by arranging a second layer of the starting material thereon.

5. The method as claimed in claim 1, wherein the starting material is a sheet material.

6. The method as claimed in claim 1, wherein the starting material is made of a material selected from the group consisting of glass, silicon, plastics and ceramic.

7. The method as claimed in claim 1, wherein the at least one shared capillary has a repeating pattern with a pitch corresponding to the pitch of the chips.

8. The method as claimed in claim 1, wherein the starting material comprises at least three layers, wherein at least one shared capillary is formed between a first layer and a second layer of the starting material, and wherein at least one shared capillary is formed between the second layer and a third layer of the starting material.

9. The method as claimed in claim 1, wherein step (c) is performed by supplying a plurality of functionalization fluids to the at least one shared capillary, wherein said plurality of functionalization fluids are supplied subsequently.

10. The method of claim 1, wherein the functionalizing comprises:
   supplying the functionalization fluid to the fluidic inlet, thereby running the functionalization fluid through the at least one shared capillary; and
   collecting the supplied functionalization fluid as the functionalization fluid exits the at least one shared capillary via the fluidic outlet.

* * * * *